United States Patent [19]

Clouser

[11] Patent Number: 4,871,939
[45] Date of Patent: Oct. 3, 1989

[54] PIEZOELECTRIC MOTOR

[75] Inventor: Michael T. Clouser, Indianapolis, Ind.

[73] Assignee: Emhart Industries, Inc., Indianapolis, Ind.

[21] Appl. No.: 135,718

[22] Filed: Dec. 21, 1987

[51] Int. Cl.[4] .......................................... H01L 41/08
[52] U.S. Cl. .................................... 310/332; 310/330
[58] Field of Search ........................ 310/328, 330–332

[56] References Cited

U.S. PATENT DOCUMENTS

| | | | |
|---|---|---|---|
| 3,192,416 | 6/1965 | Gerber | 310/330 |
| 3,192,417 | 6/1965 | Seck et al. | 310/332 |
| 3,297,889 | 1/1967 | Breskend | 310/330 X |
| 3,302,043 | 1/1967 | Berger | 310/330 X |
| 3,504,206 | 3/1970 | Fritsch | 310/332 X |
| 3,596,116 | 7/1971 | Walton | 310/332 |
| 3,694,681 | 9/1972 | Horstmann et al. | 310/332 |
| 4,056,743 | 11/1977 | Clifford et al. | 310/330 X |

*Primary Examiner*—Mark O. Budd
*Attorney, Agent, or Firm*—Carl A. Forest

[57] ABSTRACT

An elongated bilaminate bender is formed from a pair of piezoelectric ceramic sheets laminated to a conductive metallic strip. In response to an alternating current, the bender bends in a direction substantially perpendicular to its long axis, first one way and then the opposite. One end of a pivot bar is driven by the bender. A spring provides a bias force opposite to the direction that the pivot bar is pushed by the bender, to return the pivot bar when the bender bends in the opposite direction. A pair of pawls attached one on either side of the pivot axis of the bar, alternately drive a ratchet wheel on the bender drive stroke and the return stroke. The ratchet wheel turns a drive shaft. A stop prevents the pivot bar from exactly following the motion of the bender, so that the motion of the drive shaft is independent of voltage fluctuations of the alternating current.

6 Claims, 1 Drawing Sheet

PIEZOELECTRIC MOTOR

BACKGROUND OF THE INVENTION

1. Field of the Invention.

The present invention relates to piezoelectric motors and particularly to such a motor that is particularly well suited for use in the appliance timer industry.

2. Description of the Prior Art.

Motors that are used for powering timers in appliances are well known in the art. Such motors should be relatively small, displacing volumes of about five to ten cubic inches or less, but at the same time capable of turning mechanical timing cams and switches precisely and reliably. Many such conventional motors have been developed, all of which require a relatively large number of parts, such as a permanent magnet rotor, a metal stator, a coil winding, and a field plate, which parts can be relatively expensive to fabricate. Many piezoelectric motors have been developed for use in such products as watches, cameras and even a small fan. See for example, the article entitled "Piezoelectricity Powers Tiny Fans", by David S. Bak in *Design News*, Oct. 24, 1983 pp. 86-87. While all of these piezoelectric motors are small, none are of a design that would be useful for appliance timing functions.

SUMMARY OF THE INVENTION

It is an object of the invention to provide a motor of the order of five to ten cubic inches in volume which has relatively few parts and is relatively inexpensive to manufacture.

It is another object of the invention to provide a piezoelectric motor that is useful in appliance timer applications.

It is a further object of the invention to provide a piezoelectric motor that overcomes one or more of the disadvantages of prior art piezoelectric motors.

The invention provides a motor comprising means for electrically connecting to a source of alternating current; elongated piezoelectric means electrically connected to said means for connecting and responsive to the alternating current for bending in one direction substantially perpendicular to the axis of elongation when the alternating current is in the negative portion of its cycle and bending in the opposite direction to the one direction when the alternating current is in the positive portion of its cycle; drive means for transmitting rotational motion; ratchet means responsive to the piezoelectric means for turning the drive means in a predetermined angular direction in response to the bending of the piezoelectric means. Preferably, the piezoelectric means comprises a bilaminate bender. Preferably, the ratchet means comprises a pivoting means for pivoting about a pivot axis in response to the bending of the piezoelectric means, a ratchet wheel and a drive pawl means, said drive pawl means connected to the pivot means for driving the ratchet wheel. Preferably the pivot means comprises a pivot axel and a pivot member pivotable about the axel, and the drive pawl means comprises two drive pawls, the first connected to the pivot member on one side of the pivot axis and the second connected to the pivot on the opposite side of the pivot axis. Preferably, the ratchet means further comprises a bias means for applying a bias force in a direction opposite to a direction the pivot means responds to the piezoelectric means. In another aspect, preferably the ratchet means also includes a ratchet wheel and a drive pawl means responsive to the motion of the piezoelectric means for driving the ratchet wheel in the predetermined angular direction, and the ratchet wheel includes ratchet teeth interspaced by cammed surfaces and the drive pawl means includes a hinge means for permitting the drive pawl to follow the cammed surfaces of the ratchet wheel.

In another aspect, the invention comprises a motor comprising: means for electrically connecting to a source of alternating current; elongated piezoelectric means electrically connected to the means for connecting and responsive to the alternating current for bending in one direction substantially perpendicular to the axis of elongation when the alternating current is in the negative portion of its cycle and bending in the opposite direction to the one direction when the alternating current is in the positive portion of its cycle; drive means for transmitting the motion of the motor; and means responsive to the bending of the piezoelectric means for moving the drive means a predetermined amount, independent of voltage fluctuations of the alternating current, in a predetermined time. Preferably the drive means comprises a drive shaft and the means for moving comprises a ratchet means, responsive to the piezoelectric means, for turning the drive shaft.

The motor according to the invention is not only of a size and power suitable for use with appliance timers but also is lightweight as compared to prior art timer motors, thus further reducing structure costs to support it, and allowing it to be mounted in a wider variety of locations. In addition, the motor turns a predetermined amount in a predetermined time, unaffected by voltage variations in the line, thus further lending itself to precise timing functions. Numerous other features, objects, and advantages of the invention will become apparent from the following detailed description when read in conjunction with the accompanying drawings.

DESCRIPTION OF THE PREFERRED EMBODIMENT

Figure 1:
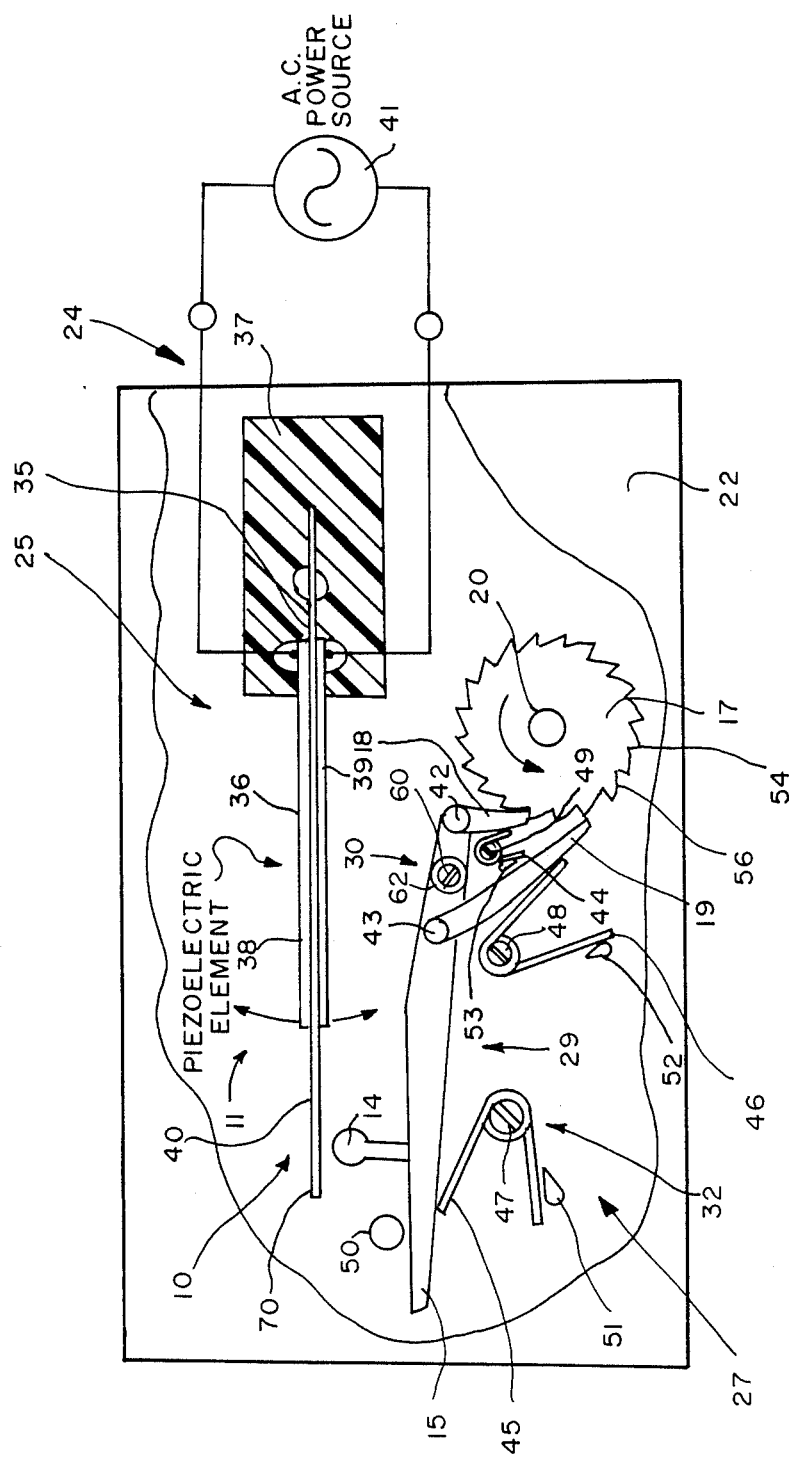
FIG. 1 is a diagrammatic plane view of the preferred embodiment of a piezoelectric motor according to the invention with the housing partially cut away to show the component parts of the motor.

Directing attention to FIG. 1, a preferred embodiment of a piezoelectric motor according to the invention is shown. It is to be understood that the embodiment shown is by way of example and is not intended to be limiting. Briefly reviewing the motor and its operation to orient the reader, a bilaminate piezoelectric bender 10 bends in the directions shown by the arrow 11 and pushes against anvil 14 thereby pivoting bar 15 and driving ratchet wheel 17 via pawls 18 and 19. Ratchet wheel 17 provides power to a timer mechanism or other machine via drive shaft 20.

Turning now to a more detailed description of the preferred embodiment of the invention the exemplary piezoelectric motor shown includes housing 22, means 24 for connecting to a source of alternating current, elongated piezoelectric means 25 responsive to the alternating current for bending in one direction substantially perpendicular to the axis of elongation when the alternating current is in the negative portion of its cycle and bending in the opposite direction to the aforesaid one direction when the alternating current is in the positive portion of its cycle, drive means 20 for transmitting rotational motion, and ratchet means 27 responsive to the piezoelectric means 25 for turning the drive means 20 in a predetermined angular direction (as shown by the arrow on ratchet wheel 17) in response to the bending of the piezoelectric means 25. Preferably, the ratchet means 27 comprises a pivoting means 29 for pivoting about a pivot axis in response to the bending of piezoelectric means 25. Preferably, the ratchet means 27 includes a bias means 32 for applying a bias force in a direction opposite to the direction the pivoting means 29 moves in response to the piezoelectric means 25.

In the preferred embodiment, piezoelectric means 25 includes a bilaminate bender 36 and a bender support 37. Bender 36 preferably comprises two elongated sheets 38 and 39 of piezoelectric material laminated to a flexible conductive sheet 40. By "elongated" is meant that the length is sufficient to produce sufficient bending to operate the ratchet means 27. Preferably the piezoelectric material is ceramic and the conductive sheet 40 is brass. Such bilaminate benders are available from Piezo Electric Products, Inc., 212 Durham Ave., Metuchen, N.J. 08840, Tel (201) 548-2800, and are described in U.S. Pat. No. 4,498,851. Support 37 is preferably bakelite plastic, injection molded as part of housing 22 and bender 36 is attached by slipping it into slot 35 and securing it by plastic melt staking. Preferably support 37 grasps about 3/8 inches of piezoelectric sheets 38 and 39. Preferably the means 24 for providing a alternating current source are wires which are adapted for connection to a conventional AC power source 41. In the preferred embodiment, drive means 20 comprises a drive shaft integrally formed with ratchet wheel 17. Ratchet means 27 preferably comprises pivot bar 15, anvil 14, pivot axel 30, pawls 18 and 19, ratchet wheel 17, hinges 42 and 43, springs 44, 45 and 46, screws 47, 48 and 49, and stops 50, 51, 52 and 53. Such parts are well known in the mechanical art and thus will not be described in great detail. Pivot bar 15 and anvil 14 are preferably formed as a single molded glass-filled nylon piece, although it may be formed of aluminum or other suitable material and in two parts. Ratchet wheel 17 is preferably formed with ratchet teeth, such as 54, interspaced by cammed surfaces, such as 56, and is made of glass-filled nylon, though it also may be injection molded of plastic or made of metal or other suitable materials. Drive pawls 18 and 19 are preferably attached to pivot bar 15 by hinge means 42 and 43 respectively for permitting the drive pawls to follow the cammed surfaces, such as 54, of the wheel 17. Hinges 42 and 43 are preferably brass pins. Pawls 18 and 19 are preferably formed of glass-filled nylon but also may be brass, plastic or other suitable material. Pivot axel 30 preferably comprises a screw 60 and plastic bushing 62. Springs 44, 45 and 46 are preferably made of stainless steel. Stops 50, 51 and 52 are preferably integrally molded as part of the housing body 22.

The motor according to the invention operates as follows. The AC power source provides an alternating voltage which can be described, as is well known, in terms of a cycle having a positive portion and a negative portion. Piezoelectric elements 38 and 39 respond to the voltages by alternately expanding and contracting. The elements are chosen so that one expands as the other contracts. The results is that the bender 10 will bend in a direction substantially perpendicular to its long axis, first one way and then the other, as shown by the arrows 11. By substantially is meant within a small arc of less than 15 degrees of perpendicular as shown generally by the arrow 11. When moving in the downward direction in the FIG., the bender pushes an anvil 14 which causes bar 15 to pivot about axis 30, causing drive pawl 44 to drive ratchet wheel 17. Springs 44 and 46 provide a bias force to keep pawls 18 and 19 respectively in contact with wheel 17. Spring 45 provides a bias force opposite to the direction of the pivot bar 15 moves when the bender 10 pushes against it. Thus, when bender 10 bends back in the opposite direction, spring 45 pushes pivot bar in the opposite direction also until it abuts stop 50. As it pivots in the opposite direction, pawl 18 becomes the drive pawl and drives wheel 17.

It is a feature of the invention that the stop 50, pivot bar 15, pivot axel 30, wheel 17 and the other parts of the ratchet means 27 are designed so that wheel 17 turns a predetermined amount with each cycle of bender 10. Since the piezoelectric elements locks on to or synchronizes with the AC line frequency, the motor then turns a predetermined amount in a predetermined time. Thus the motor is well suited for precise timing applications. It is noted that the stop 50 is arranged so that the anvil 14 does not directly follow bender 10 through its entire cycle. This is illustrated in the drawing by a small gap between anvil 14 and bender 10. (It is noted that this gap is exaggerated due to the graphic limitations of the drawing.) If the anvil 14 did follow the bender 10 exactly, then the amount of movement could depend on the line voltage which can fluctuate. Thus, the means 27 for moving the drive means 20 moves the drive means 20 independent of voltage fluctuations of the alternating current. By "voltage fluctuations" is meant ordinary changes in the peak (positive or negative) AC voltage level which changes the quantity of movement of the distal end 70 of bender 10 without surpassing the design parameters and changing the nature of the movement of bender 10 or ratchet means 27.

A novel piezoelectric motor of a size and power suitable for use in appliance timers has been described. It is evident that those skilled in the art may now make many uses and modifications of the specific embodiment described without departing from the inventive concepts. For example, many other designs of the ratchet means 27 may be used. Other types of materials can be employed. Consequently, the invention is to be construed as embracing each and every novel feature and novel combination of features present in the motor described.

What is claimed is:
1. A motor comprising:
means for electrically connecting to a source of alternating currents;
elongated piezoelectric means electrically connected to said means for connecting and responsive to said alternating current for bending in one direction substantially perpendicular to the axis of elongation when said alternating current is in the negative portion of its cycle and bending in the opposite direction to said one direction when said alternating current is in the positive portion of its cycle;
drive means for transmitting rotational motion; and
ratchet means responsive to said piezoelectric means for turning said drive means in a predetermined angular direction in response to said bending of said piezoelectric means, said ratchet means comprising:
a rachet wheel;

a pivot axle and a pivot means pivotable about said axle in response to the bending of said piezoelectric means; and drive pawl means for driving said ratchet wheel, said drive pawl means comprising a first drive pawl connected to said pivot member on one side of said pivot axle and a second drive pawl connected to said pivot member on the other side of said pivot axle.

2. A motor as in claim 1 wherein said piezoelectric means comprises a bilaminate bender.

3. A motor as in claim 2 wherein said bilaminate bender includes a conducting metal sheet between two laminations of piezoelectric material.

4. A motor as in claim 1, wherein said ratchet means further comprises a bias means for applying a bias force in a direction opposite to the direction said pivot means moves in response to said piezoelectric means.

5. A motor as in claim 1 wherein said ratchet wheel includes ratchet teeth interspaced by cammed surfaces and said drive pawl means includes a hinge means for permitting said drive pawl to follow the cammed surfaces of said wheel.

6. A motor as in claim 1 wherein said ratchet means further comprises a means for turning said drive means a predetermined angular amount, independent of voltage fluctuations in said alternating current, in a predetermined time.

* * * * *